United States Patent [19]

Suzuki et al.

[11] Patent Number: 5,021,296
[45] Date of Patent: Jun. 4, 1991

[54] CIRCUIT BOARD AND PROCESS FOR PRODUCING THE SAME

[75] Inventors: Yoshihiro Suzuki; Toshinari Takada, both of Hitachi; Masahiro Suzuki, Iwaki; Haruo Akahoshi; Akira Nagai, both of Hitachi; Akio Takahashi, Hitachiota; Shigeo Amagi; Toshikazu Narahara, both of Naka; Motoyo Wajima, Yokohama; Kiyonori Kogawa, Hiratsuka, all of Japan

[73] Assignee: Hitachi, Ltd., Tokyo, Japan

[21] Appl. No.: 408,530

[22] Filed: Sep. 18, 1989

[30] Foreign Application Priority Data

Sep. 20, 1988 [JP] Japan ................. 63-233630

[51] Int. Cl.$^5$ ............................................. B32B 9/00
[52] U.S. Cl. ........................................ 428/409; 428/209; 428/457; 428/901; 361/397
[58] Field of Search .............. 428/209, 409, 457, 901; 361/397; 174/68.5; 427/96; 156/60, 233

[56] References Cited

U.S. PATENT DOCUMENTS

| | | | |
|---|---|---|---|
| 4,642,161 | 2/1987 | Akahashi et al. | 156/314 |
| 4,696,861 | 9/1987 | Tatematsu et al. | 428/328 |
| 4,774,122 | 9/1988 | Adler | 428/156 |
| 4,806,432 | 2/1989 | Eguchi et al. | 428/457 |

OTHER PUBLICATIONS

Jap. Pat. Abs. 52-079271, Jul. 4, 1977, Fujitsu.

Primary Examiner—Patrick J. Ryan
Attorney, Agent, or Firm—Antonelli, Terry, Stout & Kraus

[57] ABSTRACT

A circuit board, which comprises an insulating substrate, a copper wiring having a coarsely roughened surface provided on the insulating substrate, and a copper oxide-reduced layer provided on the coarsely roughened surface of the copper wiring and formed by reduction of copper oxide and electroless plating, the copper oxide-reduced layer having a finely roughed surface and having a deposited layer of at least one of nickel and cobalt, where the copper oxide-reduced layer having a deposited layer of at least one of nickel and cobalt on the surface is roughened in a range of 0.05 to 5 $\mu$m in terms of a maximum vertical distance between the top of convex parts and the bottom of concave parts of the copper oxide-reduced layer per $\mu$m of the longitudinal distance of the copper oxide-reduced layer, and at least one of nickel and cobalt is deposited in an amount of $5 \times 10^{-7}$ to $1 \times 10^{-4}$ g/cm$^2$ on the copper oxide-reduced layer, has a high adhesiveness to an insulating resin.

33 Claims, 6 Drawing Sheets

CIRCUIT BOARD AND PROCESS FOR PRODUCING THE SAME

BACKGROUND OF THE INVENTION

This invention relates to a circuit board of high reliability and particularly to the surface treatment of a copper wiring suitable for securing a high adhesiveness between the copper wiring and resin on a circuit board.

In order to increase the adhesiveness between the copper wiring and the resin, it has been often used to roughen the surface of the copper wiring to increase the anchoring action of the copper toward the resin and also to increase the chemical bonding of copper to the resin due to the coordinate bonding or hydrogen bonding. In order to increase the anchoring action of copper to the resin, it is necessary that the projections of copper on the roughened surface of copper wiring are mechanically and tightly embedded in the resin and the projections themselves are also mechanically strong.

As a roughening treatment of the surface of a copper wiring to increase the adhesiveness between the copper wiring and the resin on a multi-layered, printed board, U.S. Pat. No. 4,642,161 discloses a process which comprises roughening the surface of a copper wiring by etching, forming a copper oxide layer thereon, and reducing the copper oxide layer, thereby obtaining a chemically stable, finely roughened layer surface. However, the thus obtained roughened layer is poor in the chemical activity and the projections themselves are not enough in the mechanical strength Thus, the roughened layer is not sufficient for producing a multi-layered, printed board of much higher reliability.

Independently of the U.S. Pat. No. 4,642,161, Japanese Patent Application Kokai (Laid-open) No. 52-79271 mentions roughening of a copper wiring by electroless plating or electroless plating on a surface-roughened copper wiring, thereby increasing the adhesiveness between the copper wiring and the resin, but fails to disclose detailed conditions for carrying out the electroless plating in Examples.

The Japanese Patent Application Kokai (Laid-Open) No. 52-1-59271 also mentions electroless plating of nickel or other metals on a copper wiring by reduction and formation of rather porous metal layer with projections on the copper wiring by controlling the electroless plating conditions, irrespective of the metal species, but fails to disclose detailed actual conditions for carrying out the electroless plating in Examples. Thus, it is technically quite impossible to produce a desired surface-treated layer.

The adhesiveness between a copper wiring and a resin depends upon the mechanical characteristics, and chemical and physical bondings at the boundary between the copper wiring and the resin. In case of a resin having a poor affinity to the copper wiring, it is difficult to obtain sufficient chemical and physical bondings. Even if the chemical and physical bondings are high, it is necessary to take the coefficient of thermal expansion and the modulus of elasticity of the resin into consideration when there is a possibility for thermal changes. When the resin has a high modulus of elasticity and a more largely different coefficient of thermal expansion than that of a copper wiring, it is difficult to obtain a satisfactory adhesiveness.

SUMMARY OF THE INVENTION

An object of the present invention is to obtain a satisfactory adhesiveness between a copper wiring and a resin, even if the resin has a high modulus of elasticity and a more largely different coefficient of thermal expansion than that of the copper wiring.

The first aspect of the present invention is to provide a circuit board, which comprises an insulating substrate, a copper wiring having a coarsely roughened surface provided on the insulating substrate, and a copper oxide-reduced layer provided on the coarsely roughened surface of the copper wiring and formed by reduction of copper oxide and electroless plating, the copper oxide-reduced layer having a finely roughened surface and having a deposited layer of at least one of nickel and cobalt.

The second aspect of the present invention is to provide a process for producing a circuit board, which comprises a step of coarsely roughening the surface of a copper wiring on an insulating board, a step of forming a copper oxide layer by oxidizing the coarsely roughened surface of the copper wiring, and a step of electrolessly plating at least one of nickel and cobalt on the copper oxide layer while reducing the copper oxide of the copper oxide layer, thereby forming a deposited layer of at least one of nickel and cobalt on the copper oxide-reduced layer.

The third aspect of the present invention is to provide a multi-layered circuit board, which comprises a plurality of circuit boards each comprising an insulating substrate, a copper wiring having a coarsely roughened surface provided on the insulating substrate, and a copper oxide-reduced layer provided on the coarsely roughened surface of the copper wiring and formed by reduction of copper oxide and electroless plating, the copper oxide-reduced layer having a finely roughened surface and having a deposited layer of at least one of nickel and cobalt, laminated through an insulating resin.

The fourth aspect of the present invention is to provide a process for producing a multilayer circuit board, which comprises a step of coarsely roughening the surface of a copper wiring on an insulating board, a step of forming a copper oxide layer by oxidizing the coarsely roughened surface of the copper wiring, a step of electrolessly plating at least one of nickel and cobalt on the copper oxide layer while reducing the copper oxide of the copper oxide layer, thereby forming a deposited layer of at least one of nickel and cobalt on the copper oxide-reduced layer, and a step of laminating a plurality of the thus prepared circuit boards through an insulating resin.

In the present circuit board, formation of a copper wiring and a copper oxide layer thereon can be carried out by a known method, for example, by forming a copper wiring by a resist pattern, roughening the surface of the copper wiring by etching and the oxidizing the etched surface, thereby forming a copper oxide layer. In place of the surface roughening by etching, the surface of the copper wiring can be subjected to electroless copper plating to form knife-shaped copper projections on the surface (U.S. Pat. application Ser. No. 383,074/89).

In the present invention, the copper oxide layer can be directly subjected to an electroless plating with an electroless plating containing at least one of nickel and cobalt compounds and a boron compound excluding boric acid as a reducing agent, whereby the copper oxide in the copper oxide layer is reduced to copper with the reducing agent at the same time as the electroless plating is carried out to form a reduced copper layer and a deposited layer of at least one of nickel and cobalt correspondingly on the surface of the reduced copper layer. Alternately, the copper oxide layer can be subjected to a reduction treatment in advance to form a reduced copper layer, and then a layer of at least one of nickel and cobalt can be deposited on the reduced copper layer by the electroless plating.

Figure 2:
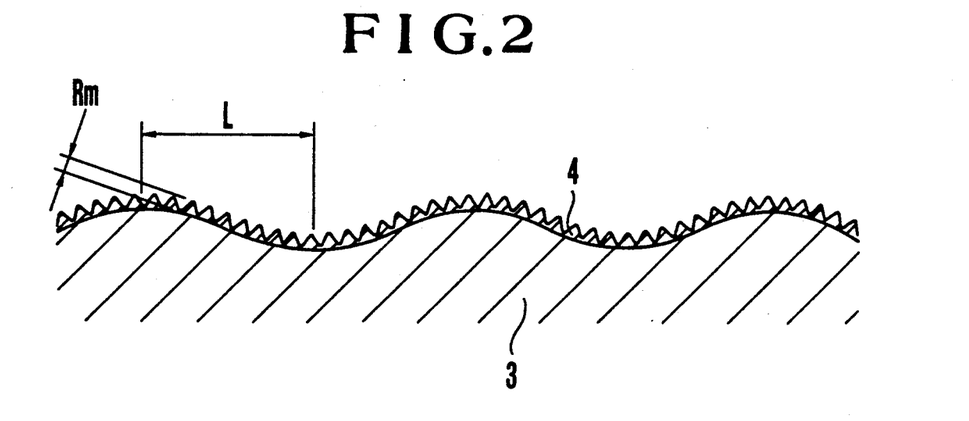
FIG. 2 is a view showing a site for determining the state of roughness of a copper oxide-reduced layer on the surface of a copper wiring.

The state of roughness of the copper oxide-reduced layer on the copper wiring in the present invention is determined according to Japanese Industrial Standard (JIS) B0601, as shown in FIG. 2. That is, FIG. 2 shows one example of a site for determining the state of roughness of copper oxide-reduced layer 4 resulting from the treatment of the copper wiring surface, where L is a longitudinal unit distance of the layer and Rm is a maximum vertical distance between the top of convex parts and the bottom of concave parts of the copper oxide-reduced layer per longitudinal unit distance. In the present invention, Rm is in a range of 0.5 to 5 μm when L is 1 μm.

In the electroless plating to deposit at least one of nickel and cobalt and also reduce the copper oxide in the copper oxide layer at the same time as the most important treatment of the present invention, a boron compound is used as a reducing agent. Boric acid $H_3BO_3$ as a buffer agent has no function as such a reducing agent. Hypophosphites so far often used as a reducing agent have been found inappropriate for the present electroless plating, but have been found to have a distinguished effect when used at the second stage of a two-stage process using the boron compound at the first stage, as will be explained later.

Examples of the boric compound includes dimethylamineborane, diethylamineborane, ammonia borane and sodium borohydride, at least one of which is used as a reducing agent in the present electroless plating of at least one of nickel and cobalt. Electroless plating of nickel with sodium borohydride as a reducing agent is disclosed in T. Hayashi; H. Yamamoto Physical properties of functional plating film, pages 88-91, published by Nikkan Kogyo Shinbun K.K., Japan, on Apr. 16, 1986.

It has been found that in a two-stage electroless plating of carrying out electroless plating of at least one of nickel and cobalt or together with iron or zinc with a hypophosphite, for example, sodium hypophosphite as a reducing agent at the second stage after the electroless plating of at least one of nickel and cobalt with a boron compound as a reducing agent at the first stage, the adhesiveness between the copper wiring and the resin can be much improved.

It is preferable to deposit $5 \times 10^{-7}$ to $1 \times 10^{-4}$ g/cm² of at least one of nickel and cobalt on a copper oxide-reduced layer by electroless plating of one-stage process or two-stage process, whereby the peeling strength and uniform deposition of layer of at least one of nickel and cobalt can be improved.

When a boron compound is used as a reducing agent, the copper oxide-reduced layer having a deposited layer of at least one of nickel and cobalt on the surface contains boron up to a maximum content of 1% by weight. When at least one of nickel and cobalt is deposited by a two-stage electroless plating process using a boron compound as a reducing at the first stage and a hypophosphite as a reducing agent at the second stage, the copper oxide-reduced layer contains both boron and phosphorus up to a maximum boron content of 1% by weight and a maximum phosphorus content of 4% by weight, and the boron is dominant toward the copper wiring side.

When an iron compound or a zinc compound is used in the electroless plating at the second stage together with hypophosphite as a reducing agent besides a nickel compound and/or a cobalt compound, iron or zinc can be deposited together with nickel and/or cobalt.

The resin for use in the present invention is an insulating resin for a substrate and a prepreg and is any one of the ordinary epoxy resin, polyimide resin, etc., among which a thermosetting resin composed mainly of addition-type bismaleimide and polyvinylbromophenol derivative is preferable.

In the present invention, a multi-layered circuit board can be produced by laminating a plurality of the thus prepared circuit boards by bonding using a prepreg resin according to a known lamination bonding process. It is needless to say that the multi-layered circuit board can be subjected to a throughhole formation and an interlayer connection after the lamination bonding, or throughholes are formed in advance, followed by positioning and lamination bonding.

The copper oxide-reduced layer having the roughened surface and a deposited layer of at least one of nickel and cobalt on the surface, formed on the surface of a copper wiring according to the present invention, has a distinguished anchoring action toward the resin and furthermore the deposited metal layer has a high mechanical strength and thus can have a strong adhesion even to a resin having a high modulus of elasticity by suppressing changes at the boundary due to a thermal expansion of the resin. It has been also found that the state of deposited metal by electroless plating can be improved with a boron compound as a reducing agent.

The present invention will be described in detail below, referring to Examples and drawings.

BRIEF DESCRIPTION OF THE DRAWINGS

FIGS. 4 to 10 are electron microscope pictures of the surface of a copper oxide layer, the surfaces of copper oxide-reduced layers having a deposited nickel layer by electroless copper plating and the surface of a deposited copper layer by electroless plating (magnification for each: X 2,000). That is.

In FIGS. 1A to 1D, 2 and 3A to 3B, numeral 1 is a copper foil, 2 is a resin reinforced with glass cloth, 3 is a copper wiring, 4 is a copper oxide-reduced layer having a deposited metal layer on the surface by electroless plating, 5 is a resist, and 6 is an electroless copper plating layer.

PREFERRED EMBODIMENTS OF THE INVENTION

EXAMPLE 1

Figure 1A:
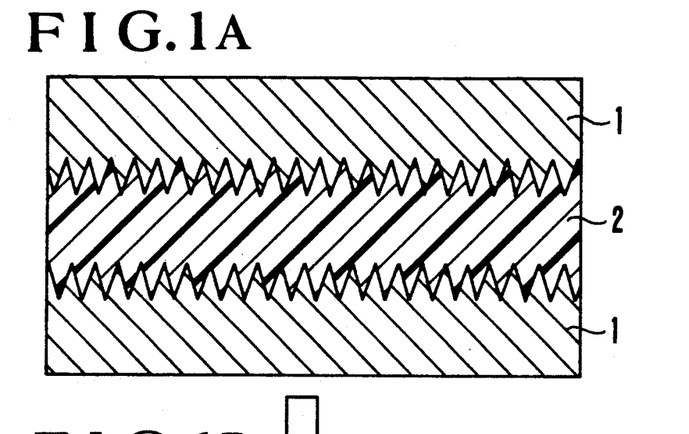
FIGS. 1A to 1D and FIGS. 3A to 3B are cross-sectional views showing steps of processes according to embodiments of the present invention.

Resin substrates 2 each having copper foils 1 at both sides [metal-clad laminate (MCL) boards], as shown in FIG. 1A, was prepared by hot pressing copper foils 1 having a coarsely roughened surface at one side (foil thickness: 70 μm) and a half-cured resin 2 reinforced with glass cloth (prepreg resin) at 220° C. under a pressure of 30 kg/cm² for two hours while facing the roughened side of copper foil to the prepreg resin. The prepreg resin consisting of the following resin materials:

| | |
|---|---|
| Cresol novolak epoxy-modified polybutadiene | 30 wt. % |
| Poly(4-vinylbromophenyl-methacrylate) | 20 wt. % |
| 2,2'-bis[4-(4-maleimidophenoxy)-phenyl] | 50 wt. % |
| Perhexine-25B [trademark of 2,5-di(t-butylperoxy)hexine] | 0.5 phr |
| Benzoguanamine | 2.0 phr |

Figure 1B:
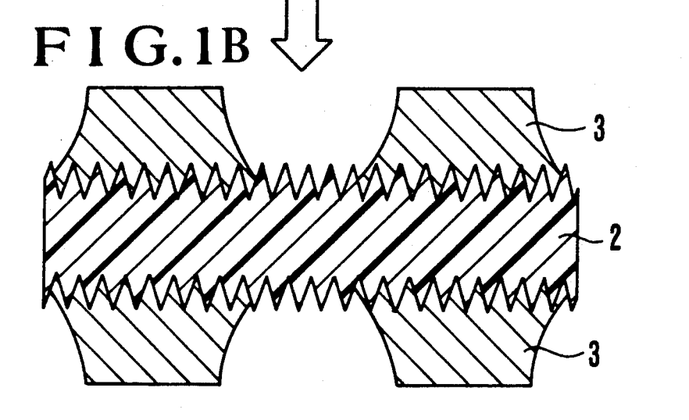

The copper foils 1 on the substrate 2 were masked with a resist and etched to form a desired copper wiring 3, as shown in FIG. 1B. Then, the substrate with the copper wiring 3 was subjected to etching with an etching solution containing 40 g of $CuCl_2$—$2H_2O$ in a liter of 17.5% HCl to roughen the copper by etching, and then dipped in one of copper oxide-forming solutions having the following composition at 85° C. for one minute, where l is a liter of water unless otherwise specially mentioned, to form a copper oxide layer on the copper wiring 3.

| | |
|---|---|
| NaOH | 15~45 g/l |
| $Na_3PO_4.12H_2O$ | 30~40 g/l |
| $NaClO_2$ | 90~270 g/l |

Figure 1C:
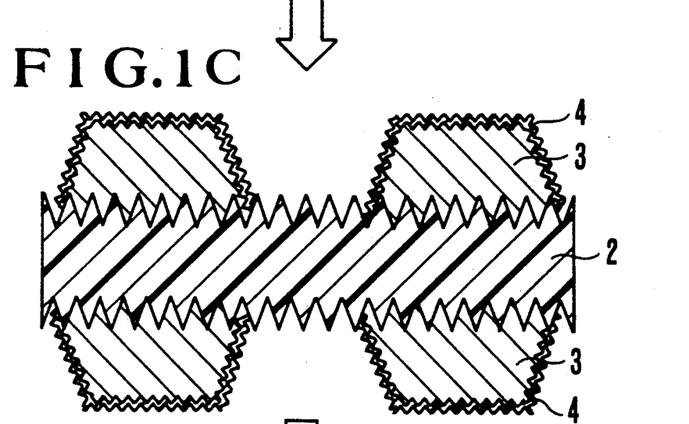

Then, the copper oxide layers on the substrates 2 were reduced and a nickel plating layer was deposited on the copper oxide-reduced layer 4 with varied nickel depositions with an electroless nickel plating solution having the following composition held at 35° C, as shown in FIG. 1C.

| | |
|---|---|
| $NiSO_4.6H_2O$ | 12 g/l |
| $Na_3C_6H_5O_7.2H_2O$ | 60 g/l |
| $H_3BO_3$ (buffer agent) | 30 g/l |
| $(CH_3)_2NHBH_3$ | 10 g/l |
| pH (adjusted with NaOH) | 9.5 |

Figure 1D:
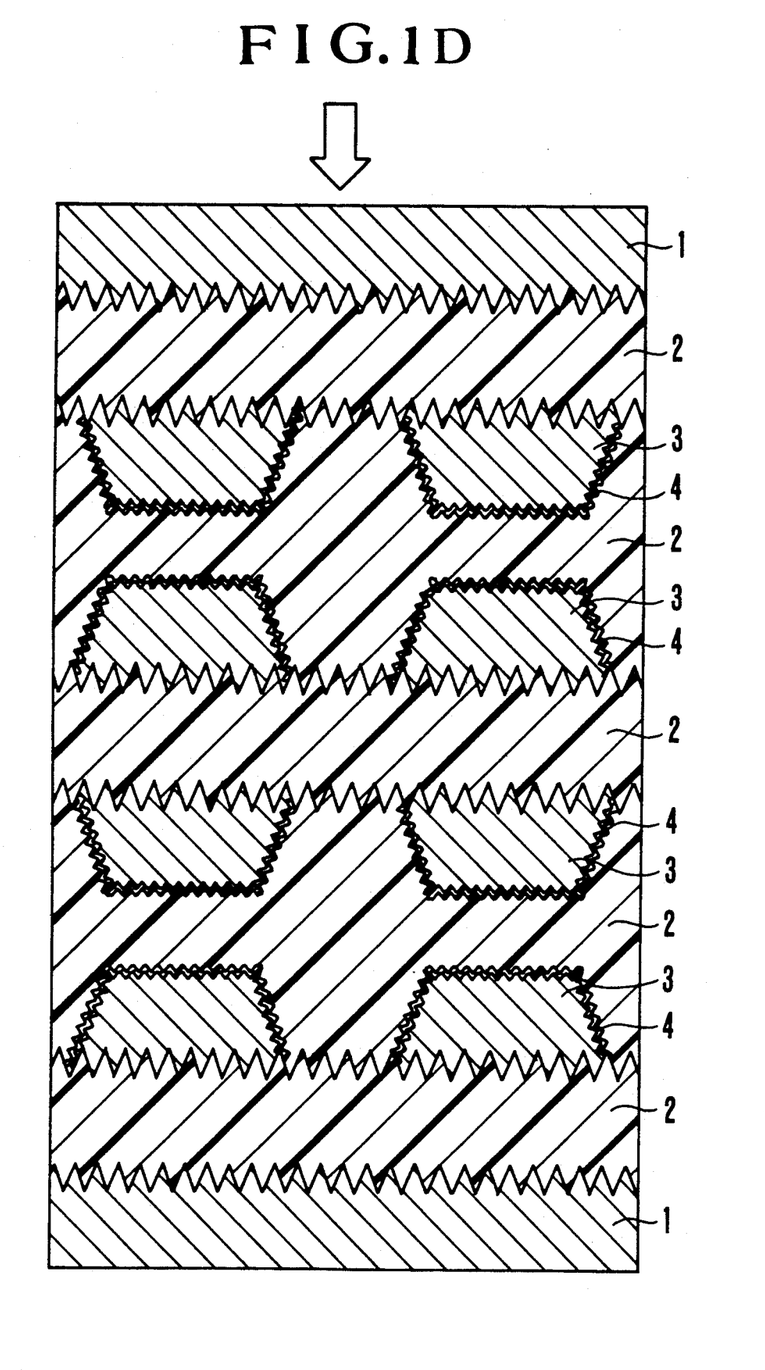

A plurality of the thus prepared MCL boards were laminated through the same prepreg resin reinforced with glass cloth as used for the half-cured resin substrate by hot pressing at 220° C. under a pressure of 30 kg/cm² for 2 hours, as shown in FIG. 1D. Then, the laminates were subjected to formation of throughholes, conductive connection treatment by plating, formation of a resist pattern on the outermost copper foils and formation of a desired copper wiring by etching to form multi-layered circuit boards.

The prepreg resin had a coefficient of thermal expansion of $7.5 \times 10^{-5}$/°C. (room temperature to 1250° C.) and a modulus of elasticity of 310 kg/mm² (room temperature). The roughness of the copper oxide-reduced layer was in a range of 0.005 to 1.0 μm in terms of a maximum vertical distance between the top of convex parts and the bottom of the concave parts of the copper oxide-reduced layer per μm of the longitudinal distance of the copper oxide-reduced layer according to JIS B 0601, as shown in FIG. 3, depending upon the compositions of the copper oxide-forming solutions.

A peeling strength between the copper oxide-reduced layer with a deposited nickel layer and the prepreg resin was measured by bonding the copper oxide-reduced layer with the deposited nickel layer on the copper foil, obtained by the same treatments as above, to the prepreg resin under the same hot press conditions as above to prepare a test piece with a width of 1 cm and by peeling the copper foil from the resin at a drawing rate of 5 cm/min. Relationship between the roughness of the copper oxide-reduced layer and the electroless nickel plating deposition is shown in Table 1.

The uniformness of the deposited nickel layer on the copper oxide-reduced layer on the resin substrate was also investigated by plating 500 electrically insulated copper patterns of 1 mm square on a resin substrate, forming a deposited nickel layer to a thickness of 0.2 μm by electroless plating on the copper oxide-reduced layer on the copper patterns, prepared in the same manner as above, and dipping the thus prepared test pieces in 17.5% HCl for one minute. The nickel deposition was judged as even "O" when the color tone of the appearance was not changed at all and as uneven "X" when the color tone was changed. The results are shown in Table 1. Overall judgement of the peeling strength and the uniformness are also given in Table 1.

Figure 4:
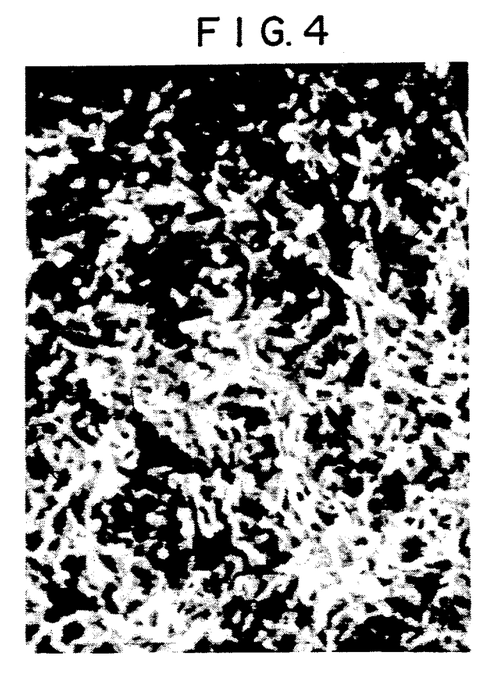
FIG. 4 shows an electron microscope picture of the surface of a copper oxide layer without a deposited nickel layer by electroless plating.
Figure 5:
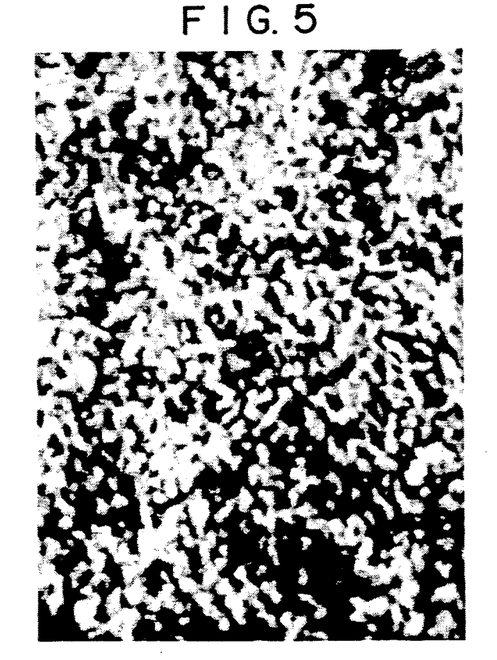
FIGS. 5, 6, 7, 8 and 9 show electron microscope pictures of the surfaces of copper oxide-reduced layers having a deposited nickel layer by electroless plating (test pieces Nos. 6, 7, 8, 9 and 10, correspondingly)
Figure 6:
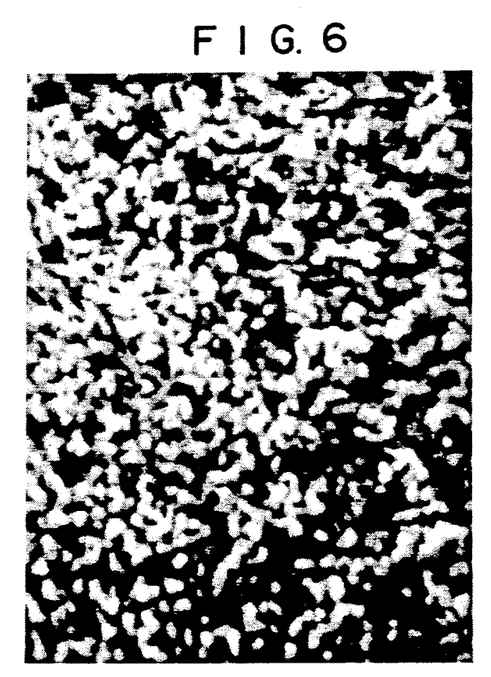
Figure 7:
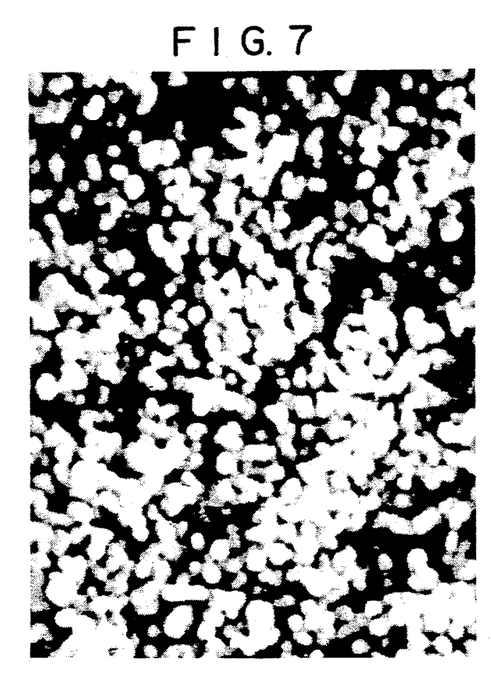
Figure 8:
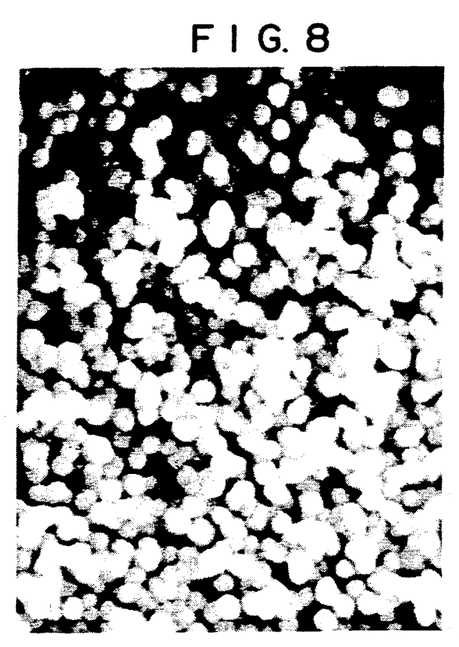
Figure 9:
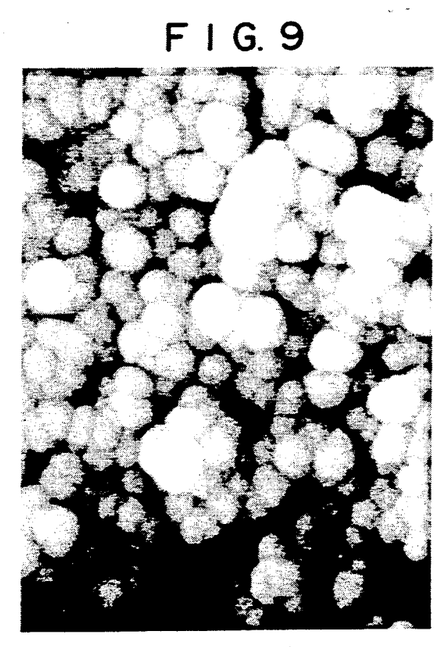

The electron microscope pictures of the copper oxide-reduced layer with a deposited nickel layer thus prepared by electroless nickel plating are shown in FIGS. 5 to 9, where FIG. 5 shows the surface state of test piece No. 6, FIG. 6 that of test piece No. 7, FIG. 7 that of test piece No. 8, FIG. 8 that of test piece No. 9 and FIG. 9 that of test piece No. 10. FIG. 4 shows the surface state of copper oxide layer without electroless nickel plating, where the peeling strength was 0.40 kg/cm at Rm=0.1 μm (L=1 μm) and the overall judgment was poor.

TABLE 1

| Test piece No. | Surface Roughness of copper oxide-reduced layer, Rm(μm), L = 1 μm | Ni deposition (g/cm²) | Peeling strength (kg/cm) | Uniformness of deposited Ni layer on copper patterns | Overall judgement |
|---|---|---|---|---|---|
| 1 | 0.005 | $1 \times 10^{-5}$ | 0.25 | O | poor |
| 2 | 0.05 | $1 \times 10^{-5}$ | 0.81 | O | good |
| 3 | 0.1 | $1 \times 10^{-5}$ | 0.85 | O | good |
| 4 | 0.5 | $1 \times 10^{-5}$ | 0.81 | O | good |
| 5 | 1.0 | $1 \times 10^{-5}$ | 0.45 | O | poor |
| 6 | 0.1 | $1 \times 10^{-7}$ | 0.55 | X | poor |
| 7 | 0.1 | $5 \times 10^{-7}$ | 0.80 | O | good |
| 8 | 0.1 | $1 \times 10^{-5}$ | 0.85 | O | good |
| 9 | 0.1 | $1 \times 10^{-4}$ | 0.81 | O | good |

TABLE 1-continued

| Test piece No. | Surface Roughness of copper oxide-reduced layer, Rm(μm), L = 1 μm | Ni deposition (g/cm²) | Peeling strength (kg/cm) | Uniformness of deposited Ni layer on copper patterns | Overall judgement |
| --- | --- | --- | --- | --- | --- |
| 10 | 0.1 | 4 × 10⁻⁴ | 0.51 | O | poor |

EXAMPLE 2

Circuit boards were prepared in the same manner as in Example 1 except that a copper oxide-forming solution having the following composition was used:

| | |
| --- | --- |
| NaOH | 15 g/l |
| Na$_3$PO$_4$.12H$_2$O | 40 g/l |
| NaClO$_2$ | 150 g/l | and an electroless cobalt plating solution having the following composition was used in place of the electroless nickel plating solution of Example 1 to reduce the copper oxide layer and form a deposited cobalt layer with varied Co depositions on the copper oxide-reduced layer:

| | |
| --- | --- |
| CoSO$_4$.7H$_2$O | 15 g/l |
| Na$_3$C$_6$H$_5$O$_7$.2H$_2$O | 60 g/l |
| H$_3$BO$_3$ (buffer agent) | 30 g/l |
| (CH$_3$)$_2$NHBH$_3$ | 20 g/l |
| pH (adjusted with NaOH) | 10.5 |

The results are shown in Table 2.

TABLE 2

| Test piece No. | Surface Roughness of copper oxide-reduced layer, Rm(μm), L = 1 μm | Ni deposition (g/cm²) | Peeling strength (kg/cm) | Uniformness of deposited Ni layer on copper patterns | Overall judgement |
| --- | --- | --- | --- | --- | --- |
| 11 | 0.1 | 2 × 10⁻⁷ | 0.58 | X | poor |
| 12 | 0.1 | 1.6 × 10⁻⁶ | 0.81 | O | good |
| 13 | 0.1 | 3 × 10⁻⁵ | 0.86 | O | good |
| 14 | 0.1 | 3 × 10⁻⁵ | 0.80 | O | good |
| 15 | 0.1 | 2 × 10⁻⁴ | 0.48 | O | poor |

EXAMPLE 3

Circuit boards were prepared in the same manner as in Example 1 except that the same copper oxide-forming solution as in Example 2 was used and an electroless nickel plating solution having the following composition was used in place of the electroless nickel plating solution of Example 1 to reduce the copper oxide layer and form a deposited nickel layer with varied nickel depositions on the copper oxide-reduced layer:

| | |
| --- | --- |
| NiSO$_4$ 6H$_2$O | 15 g/l |
| Na$_3$C$_6$H$_5$O$_7$ 2H$_2$O | 60 g/l |
| H$_3$BO$_3$ (buffer agent) | 30 g/l |
| NaBH$_4$ | 5 g/l |
| pH (adjusted with NaOH) | 9.5 |

The results are shown in Table 3.

TABLE 3

| Test piece No. | Surface Roughness of copper oxide-reduced layer, Rm(μm), L = 1 μm | Ni deposition (g/cm²) | Peeling strength (kg/cm) | Uniformness of deposited Ni layer on copper patterns | Overall judgement |
| --- | --- | --- | --- | --- | --- |
| 16 | 0.1 | 1.1 × 10⁻⁷ | 0.52 | X | poor |
| 17 | 0.1 | 1.7 × 10⁻⁶ | 0.82 | O | good |
| 18 | 0.1 | 2.5 × 10⁻⁵ | 0.87 | O | good |
| 19 | 0.1 | 4 × 10⁻⁵ | 0.81 | O | good |
| 20 | 0.1 | 4 × 10⁻⁴ | 0.47 | O | poor |

EXAMPLE 4

Circuit boards were prepared in the same manner as in Example 1, except that the copper oxide-forming solution of Example 2 was used and then the copper oxide layer was reduced with a solution containing 10 g/l of dimethylamineborane, and then a deposited nickel layer was formed on the copper oxide-reduced layer with varied nickel depositions. The results are shown in Table 4.

TABLE 4

| Test piece No. | Surface Roughness of copper oxide-reduced layer, Rm(μm), L = 1 μm | Ni deposition (g/cm²) | Peeling strength (kg/cm) | Uniformness of deposited Ni layer on copper patterns | Overall judgement |
| --- | --- | --- | --- | --- | --- |
| 21 | 0.1 | 1 × 10⁻⁷ | 0.53 | X | poor |
| 22 | 0.1 | 1.8 × 10⁻⁶ | 0.80 | O | good |
| 23 | 0.1 | 2.6 × 10⁻⁵ | 0.85 | O | good |
| 24 | 0.1 | 3.5 × 10⁻⁵ | 0.83 | O | good |
| 25 | 0.1 | 8 × 10⁻⁴ | 0.41 | O | poor |

EXAMPLE 5

Circuit boards were prepared in the same manner as in Example 1 except that the copper oxide-forming solution of Example 2 was used to form a copper oxide layer on the copper wiring and after the copper oxide layer was reduced and the deposited nickel layer was formed to a thickness of $1 \times 10^{-6}$ g/cm$^2$ with the electroless nickel plating at the first stage a second stage electroless nickel plating was carrier out with an electroless nickel plating solution having the following composition with varied nickel depositions.

| | |
|---|---|
| NiSO$_4$.6H$_2$O | 10 g/l |
| Na$_3$C$_6$H$_5$O$_7$.2H$_2$O | 70 g/l |
| H$_3$BO$_3$ (buffer agent) | 30 g/l |
| NaH$_2$PO$_2$.H$_2$O | 12 g/l |
| pH (adjusted with NaOH) | 9.5 |

The results are shown in Table 5.

TABLE 5

| Test piece No. | Surface Roughness of copper oxide-reduced layer, Rm(μm), L = 1 μm | Ni deposition (g/cm$^2$) | Peeling strength (kg/cm) | Uniformness of deposited Ni layer on copper patterns | Overall judgement |
|---|---|---|---|---|---|
| 26 | 0.1 | $1.8 \times 10^{-6}$ | 0.81 | O | good |
| 27 | 0.1 | $2.5 \times 10^{-5}$ | 0.83 | O | good |
| 28 | 0.1 | $3.8 \times 10^{-5}$ | 0.81 | O | good |
| 29 | 0.1 | $8 \times 10^{-4}$ | 0.43 | O | poor |

EXAMPLE 6

Circuit boards were prepared in the same manner as in Example 1 except that the copper oxide-forming solution of Example 2 was used and an electroless cobalt plating solution having the following composition was used in place of the electroless nickel plating solution of Example 1 to reduce the copper oxide layer and form a deposited cobalt layer with varied cobalt depositions on the copper oxide-reduced layer.

| | |
|---|---|
| CoSO$_4$.7H$_2$O | 15 g/l |
| Na$_3$C$_6$H$_5$O$_7$.2H$_2$O | 60 g/l |
| H$_3$BO$_3$ (buffer agent) | 30 g/l |
| NaBH$_4$ | 15 g/l |
| pH (adjusted with NaOH) | 8.5 |

The results are shown in Table 6.

TABLE 6

| Test piece No. | Surface Roughness of copper oxide-reduced layer, Rm(μm), L = 1 μm | Ni deposition (g/cm$^2$) | Peeling strength (kg/cm) | Uniformness of deposited Ni layer on copper patterns | Overall judgement |
|---|---|---|---|---|---|
| 30 | 0.1 | $1.1 \times 10^{-7}$ | 0.55 | X | poor |
| 31 | 0.1 | $1.9 \times 10^{-6}$ | 0.81 | O | good |
| 32 | 0.1 | $2.8 \times 10^{-5}$ | 0.85 | O | good |
| 33 | 0.1 | $1.0 \times 10^{-4}$ | 0.86 | O | good |
| 34 | 0.1 | $2.5 \times 10^{-4}$ | 0.47 | O | poor |

EXAMPLE 7

Circuit boards were prepared in the same manner as in Example 1 except that the copper oxide-forming solution of Example 2 was used and an electroless nickel plating solution having the following composition was used in place of the electroless nickel plating solution of Example 1 to reduce the copper oxide layer and form a deposited nickel layer with varied nickel depositions on the copper oxide-reduced layer.

| | |
|---|---|
| NiSO$_4$.6H$_2$O | 10 g/l |
| Na$_3$C$_6$H$_5$O$_7$.2H$_2$O | 60 g/l |
| H$_3$BO$_3$ (buffer agent) | 30 g/l |
| (C$_2$H$_5$)$_2$NHBH$_3$ | 10 g/l |
| pH (adjusted with NaOH) | 9.5 |

The results are shown in Table 7.

TABLE 7

| Test piece No. | Surface Roughness of copper oxide-reduced layer, Rm (μm), L = 1 μm | Ni deposition (g/cm$^2$) | Peeling strength (kg/cm) | Uniformness of deposited Ni layer on copper patterns | Overall judgement |
|---|---|---|---|---|---|
| 35 | 0.1 | $1.0 \times 10^{-7}$ | 0.51 | X | poor |
| 36 | 0.1 | $1.9 \times 10^{-6}$ | 0.82 | O | good |
| 37 | 0.1 | $2.9 \times 10^{-5}$ | 0.83 | O | good |
| 38 | 0.1 | $1.0 \times 10^{-4}$ | 0.81 | O | good |
| 39 | 0.1 | $9.0 \times 10^{-4}$ | 0.41 | O | poor |

EXAMPLE 8

Circuit boards were prepared in the same manner as in Example 7, except that the deposited nickel layer was formed on the copper oxide-reduced layer to a thickness of $1 \times 10^{31\ 6}$ g/cm$^2$ by electroless nickel plating and then a further deposited nickel layer with varied nickel depositions was formed thereon with the electroless nickel plating solution of Example 5 using sodium hypophosphite as a reducing agent. The results are shown in Table 8.

TABLE 8

| Test piece No. | Surface Roughness of copper oxide-reduced layer, Rm (μm), L = 1 μm | Ni deposition (g/cm²) | Peeling strength (kg/cm) | Uniformness of deposited Ni layer on copper patterns | Overall judgement |
| --- | --- | --- | --- | --- | --- |
| 40 | 0.1 | $1.9 \times 10^{-6}$ | 0.51 | O | good |
| 41 | 0.1 | $3.0 \times 10^{-5}$ | 0.86 | O | good |
| 42 | 0.1 | $8.0 \times 10^{-5}$ | 0.82 | O | good |
| 43 | 0.1 | $2.0 \times 10^{-4}$ | 0.38 | O | poor |

EXAMPLE 9

Circuit boards were prepared in the same manner as in Example 7 except an electroless nickel plating solution having the following composition was used in place of the electroless Ni plating solution of Example 7 to reduce the copper oxide layer and form a deposited nickel layer with varied nickel depositions.

| | |
| --- | --- |
| $NiSO_4 \cdot 6H_2O$ | 10 g/l |
| $Na_3C_6H_5O_7 \cdot 2H_2O$ | 60 g/l |
| $H_3BO_3$ | 30 g/l |
| $BH_3NH_3$ | 5 g/l |
| pH (adjusted with NaOH) | 9.1 |

The results are shown in Table 9.

TABLE 9

| Test piece No. | Surface Roughness of copper oxide-reduced layer, Rm (μm), L = 1 μm | Ni deposition (g/cm²) | Peeling strength (kg/cm) | Uniformness of deposited Ni layer on copper patterns | Overall judgement |
| --- | --- | --- | --- | --- | --- |
| 44 | 0.1 | $1.0 \times 10^{-7}$ | 0.51 | X | poor |
| 45 | 0.1 | $2.0 \times 10^{-6}$ | 0.82 | O | good |
| 46 | 0.1 | $3.0 \times 10^{-5}$ | 0.85 | O | good |
| 47 | 0.1 | $1.0 \times 10^{-4}$ | 0.81 | O | good |
| 48 | 0.1 | $3.0 \times 10^{-4}$ | 0.37 | O | poor |

EXAMPLE 10

Circuit boards were prepared in the same manner as in Example 5 except that after the formation of the deposited nickel layer to a thickness of $1 \times 10^{-6}$ g/cm² on the copper oxide-reduced layer with the electroless nickel plating solution of Example 1, an electroless nickel-cobalt plating solution having the following composition was used as the second stage plating at a plating temperature of 70° C. in place of the second stage electroless plating solution of Example 5.

| | |
| --- | --- |
| $NiSO_4 \cdot 6H_2O$ | 8 g/l |
| $CoSO_4 \cdot 7H_2O$ | 2 g/l |
| $Na_3C_6H_5O_7 \cdot 2H_2O$ | 80 g/l |
| $NaH_2PO_2 \cdot H_2O$ | 10 g/l |
| $H_3BO_3$ (buffer agent) | 30 g/l |
| pH (adjusted with NaOH) | 8.5 |

A high adhesiveness was obtained between the deposited metal layer and the resin with a Ni-Co deposition of up to $1 \times 10^{-4}$ g/cm².

EXAMPLE 11

Circuit boards were prepared in the same manner as in Example 10 except that 1 g/l of $FeSO_4$ was added to the second stage electroless Ni-Co plating solution. A high adhesiveness was obtained between the deposited metal layer and the resin with a Ni-Co-Fe desposition of up to $1 \times 10^{-4}$ g/cm².

EXAMPLE 12

Circuit boards were prepared in the same manner as in Example 5 except that after the formation of the deposited nickel layer to a thickness of $1 \times 10^{-6}$ g/cm² on the copper oxide-reduced layer with the electroless nickel plating solution of Example 1, an electroless nickel-zinc plating solution having the following composition was used as the second stage plating at a plating temperature of 65° C. in place of the second stage electroless plating solution of Example 10.

| | |
| --- | --- |
| $NiSO_4 \cdot 6H_2O$ | 10 g/l |
| $ZnSO_4 \cdot 7H_2O$ | 3 g/l |
| $Na_3C_6H_5O_7 \cdot 2H_2O$ | 80 g/l |
| $H_3BO_3$ (buffer agent) | 30 g/l |
| $NaH_2PO_2 \cdot H_2O$ | 12 g/l |
| pH (adjusted with NaOH) | 9.5 |

A high adhesiveness was obtained between the deposited metal layer and the resin with a Ni-Zn deposition of up to $1 \times 10^{-4}$ g/cm².

EXAMPLE 13

Figure 3A:
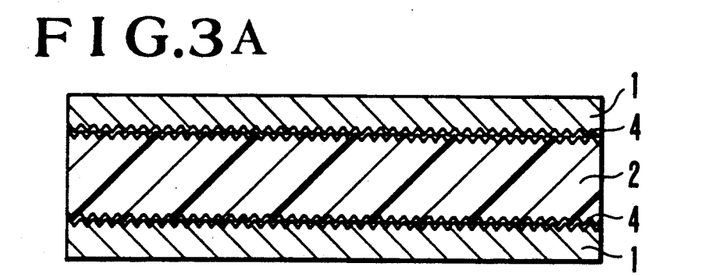
Figure 3B:
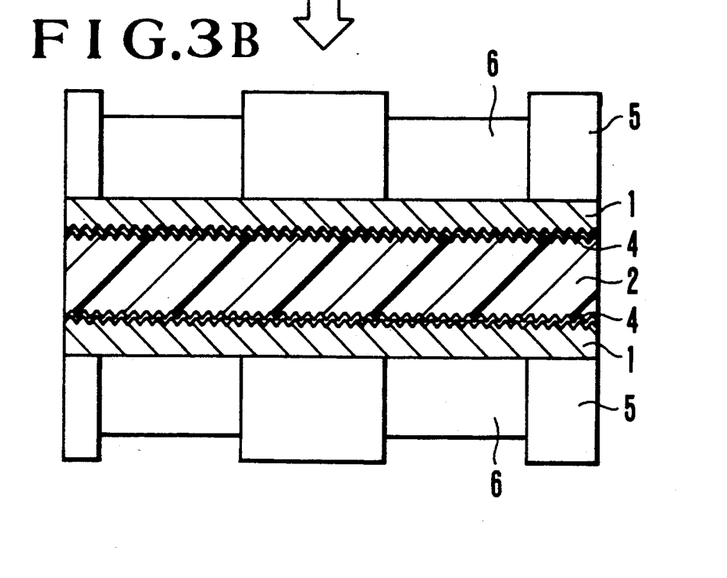

Resin substrates 2 each with copper foils 1 at both sides (MCL boards) were prepared by etching one side each of copper foils 1, each having smooth surfaces at both sides (foil thickness; 1, 2, 10, 20 and 20 30 μm) with the etching solution of cupric chloride of Example 1 in place of the copper foils with one coarsely roughened side used in Example 1, forming a copper oxide layer on the etched surfaces of copper foils 1 with the copper oxide-forming solution of Example 2, reducing the copper oxide layers and also forming a deposited nickel layer on the copper oxide-reduced layer 4 by electroless plating with the electroless nickel plating solution of Example 1, and hot pressing the resin substrate 2 with a pair of the thus treated copper foil 1 while facing the deposited nickel layer to the resin substrate 2 under the same conditions as in Example 1, as shown in FIG. 3A. The untreated copper foil surfaces at both sides were etched with the etching solution of cupric chloride of Example 1. Then, a mask pattern was formed with a resist 5 on the parts corresponding to the non-circuit parts and a thick copper plating layer was formed on the etched surface by electroless plating with an electroless copper plating solution having the following composition, as shown in FIG. 3B:

| CuSO$_4$.5H$_2$O | 4 g/l |
| --- | --- |
| disodium ethylenediamine-tetracetate | 100 g/l |
| 2,2'-dipyridyl | 0.10 g/l |
| polyethyleneglycol (average molecular weight: 600) | 60 mol/l |
| formalin | 4-6 mol/l |
| pH (adjusted with NaOH) | 12.5 |

Then, the resist was removed therefrom, and the copper was etched with the etching solution of Example 1 to form a copper wiring. Then, a copper oxide layer was formed on the copper wiring with the copper oxide-forming solution of Example 1, and multi-layered circuit boards were formed in the same manner as in Example 1 for the electroless nickel plating, etc.

The pattern precision of copper wiring, i.e. a ratio of a/b, where "b" is the lower width of copper wiring at the part to be bonded to the resin and "a" is the upper width thereof when the thick electroless copper plating layer was formed, is given in Table 19, and it is evident that the pattern precision is high when the width of the copper wiring for masking was not more than 20 μm. The surface roughness of the copper oxide-reduced layer was 0.1 μm in terms of maximum vertical distance Rm per μm of L, and the Ni deposition per unit area of deposited nickel layer was $2.5 \times 10^{-5}$ g/cm$^2$.

The peeling strength between the resin and the deposited nickel layer was investigated by etching one surface side of a copper foils with the solution of cupric chloride, forming a copper oxide layer thereon, reducing the copper oxide layer and forming a deposited nickel layer by electroless plating, bonding the copper foils to the resin while facing the deposited nickel layers to the resin, forming a thick copper layer by electroless copper plating on the untreated surfaces of copper foils to a total thickness (including the thickness of sublayer copper foil) of 70 μm under the same conditions as above, and measuring the peeling strength of the copper foils from the resin in the same manner as in Example 1.

The results are shown in Table 10.

TABLE 10

| Test piece No. | Thickness of copper foil (μm) | Pattern precision of copper wiring (a/b) | Peeling strength (kg/cm) | Overall judgement |
| --- | --- | --- | --- | --- |
| 49 | 1 | uneven and poor pattern | 0.5 or less | poor |
| 50 | 2 | 0.97 | 0.83 | good |
| 51 | 10 | 0.85 | 0.85 | good |
| 52 | 20 | 0.76 | 0.82 | good |
| 53 | 30 | 0.55 | 0.84 | poor |

EXAMPLE 14

When the copper oxide layer was formed on one side of copper foils each with smooth surfaces at both sides (foil thickness: 1, 2, 10, 20 and 30 μm) as used in Example 13, a solution adjusted to pH 12 with NaOH was used in place of the copper oxide-forming solution and the copper foil was used as an anode and a stainless steel plate as a counter-electrode in the solution by passing an electric current therebetween at a constant current density of 1.0 A/dm$^2$ to form a copper oxide layer on the foil. In place of the electroless nickel plating solution used for forming an electroless nickel plating layer in Example 13, a solution having the following composition was used:

| NiSO$_4$.6H$_2$O | 240 g/l |
| --- | --- |
| NiCl$_2$.6H$_2$O | 45 g/l |
| H$_3$BO$_3$ | 30 g/l | and a deposited nickel layer was formed in the solution with the copper foil as a cathode and a nickel plate as a counter-electrode by passing an electric current at a constant current density of 2.5 A/dm$^2$, and the surface roughness of the deposited nickel layer was 0.1 μm as Rm when L is 1 μm and the Ni deposition was $2.5 \times 10^{-5}$ g/cm$^2$ per unit area of the deposited nickel layer. By bonding the thus treated copper foil to the resin under the same conditions as in Example 13, a resin substrate with the copper foils at both sides (MCL board) was formed. Then, the thus prepared MCL boards were subjected to thick copper plating at parts corresponding to circuits with a solution having the following composition using the the copper foils on the resin substrate as cathodes and a copper plate as a counterelectrode by passing an electric current at a constant current density of 3 A/dm$^2$ in place of the electroless copper plating solution of Example 13. Other conditions were the same as in Example 13. The evaluation of the pattern precision and the peeling density were made in the same manner as in Example 13, and the results are shown in Table 11.

| CuSO$_4$.5H$_2$O | 200 g/l |
| --- | --- |
| H$_2$SO$_4$ | 50 g/l |
| NaCl | 60 μg/l |

TABLE 11

| Test piece No. | Thickness of copper foil (μm) | Pattern precision of copper wiring (a/b) | Peeling strength (kg/cm) | Overall judgement |
| --- | --- | --- | --- | --- |
| 54 | 1 | uneven and poor pattern | 0.5 or less | poor |
| 55 | 2 | 0.95 | 0.82 | good |
| 56 | 10 | 0.83 | 0.86 | good |
| 57 | 20 | 0.78 | 0.83 | good |
| 58 | 30 | 0.50 | 0.83 | poor |

COMPARATIVE EXAMPLE 1

In Example 1, it was tried to form an electroless nickel plating layer directly on the copper surface with an electroless nickel plating solution having the following composition containing NaH$_2$PO$_2$H$_2$O in place of the boron compound as a reducing agent, but it was impossible to selectively deposit nickel on the copper while preventing the deposition on the resin substrate corresponding to the non-circuit parts. When it was forcedly tried to form the electroless nickel plating layer on the copper, the plating solution turned unstable and was decomposed.

| NiSO$_4$.6H$_2$O | 10 g/l |
| --- | --- |
| Na$_3$C$_6$H$_5$O$_7$.2H$_2$O | 70 g/l |
| H$_3$BO$_3$ | 30 g/l |
| NaH$_2$PO$_2$.H$_2$O | 12 g/l |
| pH (adjusted with NaOH) | 9.5 |

COMPARATIVE EXAMPLE 2

Figure 10:
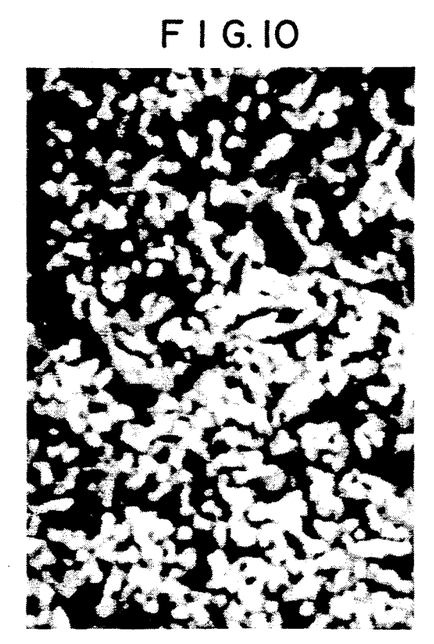
FIG. 10 shows an electron microscope picture of a deposited copper layer by electroless plating (test piece No. 61).

In Example 1, a peeling strength between an electroless copper plating layer and the resin was investigated with the electroless copper plating solution of Example 10 with varied copper depositions in place of the electroless nickel plating solution of Example 1. The results are shown in Table 12. The electron microscope picture of the deposited copper layer of test piece No. 61 is shown in FIG. 10.

TABLE 12

| Test piece No. | Surface Roughness of copper oxide-reduced layer, Rm (μm), L = 1 μm | Ni deposition (g/cm$^2$) | Peeling strength (kg/cm) | Uniformness of deposited Ni layer on copper patterns | Overall judgement |
|---|---|---|---|---|---|
| 59 | 0.1 | $1.1 \times 10^{-7}$ | 0.41 | X | poor |
| 60 | 0.1 | $1.8 \times 10^{-6}$ | 0.45 | X | poor |
| 61 | 0.1 | $2.9 \times 10^{-5}$ | 0.48 | X | poor |
| 62 | 0.1 | $1.0 \times 10^{-4}$ | 0.45 | X | poor |
| 63 | 0.1 | $3.5 \times 10^{-4}$ | 0.32 | X | poor |

According to the present invention, the copper wiring can be strongly bonded to a resin having a high modulus of elasticity and a high coefficient of thermal expansion, and thus a multi-layered printed board of mechanical and thermal reliabilities can be formed. Furthermore, according to the present invention, a multi-layered printed board with a highly precise copper wiring pattern can be formed with the resin.

What is claimed is:

1. A circuit board, which comprises an insulating substrate, a copper wiring provided on the insulating substrate, said copper wiring having a coarsely roughened surface facing the insulating substrate, and a copper oxide-reduced layer provided on a surface opposite to the coarsely roughened surface of the copper wiring and formed by reduction of copper oxide and electroless plating, the copper oxide-reduced layer having a finely roughened surface and having a deposited layer of at least one of nickel and cobalt; the roughened surface of the copper oxide-reduced layer being roughened in a range of 0.05 to 5 μm in terms of a maximum vertical distance between the top of convex parts and the bottom of concave parts of the copper oxide-reduced layer per μm of the longitudinal distance of the copper oxide-reduced layer.

2. A circuit board according to claim 1, wherein at least one of nickel and cobalt is deposited in an amount of $5 \times 10^{-7}$ to $1 \times 10^{-4}$ g/cm$^2$ on the copper oxide-reduced layer.

3. A circuit board according to claim 1, wherein the copper oxide-reduced layer having the deposited layer of at least one of nickel and cobalt on the surface contains boron.

4. A circuit board according to claim 3, wherein the boron content is maximum 1% by weight.

5. A circuit board according to claim 1, wherein the copper oxide-reduced layer having a deposited layer of at least one of nickel and cobalt on the surface contains boron and phosphorus.

6. A circuit board according to claim 5, wherein the boron content is maximum 1% by weight and the phosphorus content is maximum 4% by weight.

7. A circuit board according to claim 5, wherein the boron is dominant toward the copper wiring side.

8. A circuit board according to claim 1, wherein the surface of the copper oxide-reduced layer having the deposited layer of at least one of nickel and cobalt on the surface is coated with an insulating resin.

9. A circuit board according to claim 8, wherein the insulating resin is a thermo-setting resin composed mainly of addition-type bismaleimide and polyvinylbromophenol derivative.

10. A circuit board according to claim 1, wherein the coarsely roughed surface of the copper wiring is made by electroless copper plating.

11. A multi-layered circuit board, which comprises a plurality of circuit boards each comprising an insulating substrate, a copper wiring provided on the insulating substrate, said copper wiring having a coarsely roughened surface facing the insulating substrate, and a copper oxide-reduced layer provided on a surface opposite to the coarsely roughened surface of the copper wiring and formed by reduction of copper oxide and electroless plating, the copper oxide-reduced layer having a finely roughened surface and having a deposited layer of at least one of nickel and cobalt, laminated through an insulating resin; the copper oxide-reduced layer being roughened in a range of 0.05 to 5 μm in terms of a maximum vertical distance between the top of convex parts and the bottom of concave parts of the copper oxide-reduced layer per μm of the longitudinal distance of the copper oxide-reduced layer.

12. A multilayered circuit board according to claim 11, wherein at least one of nickel and cobalt is deposited in an amount of $5 \times 10^{-7}$ to $1 \times 10^{-4}$ g/cm$^2$ on the copper oxide-reduced layer.

13. A multi-layered circuit board according to claim 11, wherein the copper oxide-reduced layer having the deposited layer of at least one of nickel and cobalt on the surface contains boron.

14. A multi-layered circuit board according to claim 13, wherein the boron content is maximum 1% by weight.

15. A multi-layered circuit board according to claim 11, wherein the copper oxide-reduced layer having a deposited layer of at least one of nickel and cobalt on the surface contains boron and phosphorus.

16. A multi-layered circuit board according to claim 15, wherein the boron content is maximum 1% by weight and the phosphorus content is maximum 4% by weight.

17. A multi-layered circuit board according to claim 16, wherein the boron is dominant toward the copper wiring side.

18. A multi-layered circuit board according to claim 11, wherein the insulating resin is a thermosetting resin composed mainly of addition-type bismaleimide and polyvinylbromophenol derivative.

19. A multi-layered circuit board according to claim 11, wherein the coarsely roughed surface of the copper wiring is made by electroless copper plating.

20. A process for producing a circuit board, which comprises a step of roughening the surface of a copper wiring on an insulating board, a step of forming a copper oxide layer by oxidizing the roughened surface of the copper wiring, and a step of electrolessly plating at least one of nickel and cobalt on the copper oxide layer while reducing the copper oxide of the copper oxide layer, thereby forming a deposited layer of at least one of nickel and cobalt on the copper oxide-reduced layer; the copper oxide-reduced layer being roughened in a range of 0.05 to 5 μm in terms of a maximum vertical distance between the top of convex parts and the bottom of concave parts of the copper oxide-reduced layer per μm of the longitudinal distance of the copper oxide-reduced layer.

21. A process according to claim 20, wherein the step of forming the copper oxide-reduced layer is carried with an electroless plating solution containing a boron compound excluding boric acid as a reducing agent.

22. A process according to claim 21, wherein the boron compound excluding boric acid as a reducing agent is at least one of dimethylamineborane, diethylamineborane, ammonia borane and sodium borohydride.

23. A process according to claim 20, wherein the step of electrolessly plating at least one of nickel and cobalt on the copper oxide layer while reducing the copper oxide of the copper oxide layer, thereby forming a deposited layer of at least one of nickel and cobalt on the copper oxide-reduced layer is carried out at first by electroless plating with a boron compound excluding boric acid as a reducing agent and then with a hypophosphite as a reducing agent at two stages.

24. A process according to claim 23, wherein the boron compound excluding boric acid as a reducing agent is at least one of dimethylamineborane, diethylamine borane, ammonia borane and sodium borohydride, and the hypophosphite as a reducing agent is sodium hypophosphite.

25. A process according to claim 20, wherein the surface of the copper wiring on the insulating board is roughened by electroless copper plating.

26. A process according to claim 20, wherein at least on of nickel and cobalt is deposited in an amount ranging from $5 \times 10^{-7}$ to $1 \times 10^{-4}$ g/cm² on the copper oxide-reduced layer by the electroless plating.

27. A process for producing a multilayer circuit board, which comprises a step of roughening the surface of a copper wiring on an insulating board, a step of forming a copper oxide layer by oxidizing the roughened surface of the copper wiring, a step of electrolessly plating at least one of nickel and cobalt on the copper oxide layer while reducing the copper oxide of the copper oxide layer, thereby forming a deposited layer of at least one of nickel and cobalt on the copper oxide-reduced layer to prepare a metal-clad laminate board, and a step of laminating a plurality of the thus prepared boards through an insulating resin; the copper oxide-reduced layer being roughened in a range of 0.05 to 5 μm in terms of a maximum vertical distance between the top of convex parts and the bottom of concave parts of the copper oxide-reduced layer per μm of the longitudinal distance of the copper oxide-reduced layer.

28. A process according to claim 27, wherein the step of forming the copper oxide-reduced layer is carried with an electroless plating solution containing a boron compound excluding boric acid as a reducing agent.

29. A process according to claim 28, wherein the boron compound excluding boric acid as a reducing agent is at least one of dimethylamineborane, diethylamineborane, ammonia borane and sodium borohydride.

30. A process according to claim 27, wherein the step of electrolessly plating at least one of nickel and cobalt on the copper oxide layer while reducing the copper oxide of the copper oxide layer, thereby forming a deposited layer of at least one of nickel and cobalt on the copper oxide-reduced layer is carried out at first by electroless plating with a boron compound excluding boric acid as a reducing agent and then with a hypophosphite as a reducing agent at two stages.

31. A process according to claim 30, wherein the boron compound excluding boric acid as a reducing agent is at least one of dimethylamineborane, diethylamineborane, ammonia borane and sodium borohydride, and the hypophosphite as a reducing agent is sodium hypophosphite.

32. A process according to claim 27, wherein the surface of the copper wiring on the insulating board is roughened by electroless copper plating.

33. A process according to claim 27, wherein at least one of nickel and cobalt is deposited in an amount ranging from $5 \times 10^{-7}$ to $1 \times 10^{-4}$ g/cm² on the copper oxide-reduced layer by the electroless plating.

* * * * *